US012805263B2

(12) United States Patent
Qu et al.

(10) Patent No.: US 12,805,263 B2
(45) Date of Patent: Nov. 17, 2026

(54) MATERIAL FRAME UNLOCKING DEVICE

(71) Applicant: TCL ZHONGHUAN RENEWABLE ENERGY TECHNOLOGY CO., LTD., Tianjin (CN)

(72) Inventors: Mengcheng Qu, Tianjin (CN); Rui Wu, Tianjin (CN); Dawei Bai, Tianjin (CN); Zhijun Wu, Tianjin (CN); Zhengmin Cao, Tianjin (CN); Ruipeng Li, Tianjin (CN); Dawei Wang, Tianjin (CN); Yao Wan, Tianjin (CN); Xianzheng Yin, Tianjin (CN); Chen Yang, Tianjin (CN)

(73) Assignee: TCL ZHONGHUAN RENEWABLE ENERGY TECHNOLOGY CO., LTD., Tianjin (CN)

( * ) Notice: Subject to any disclaimer, the term of this patent is extended or adjusted under 35 U.S.C. 154(b) by 636 days.

(21) Appl. No.: 18/548,535

(22) PCT Filed: Jul. 31, 2023

(86) PCT No.: PCT/CN2023/110426
§ 371 (c)(1),
(2) Date: Aug. 31, 2023

(87) PCT Pub. No.: WO2024/093400
PCT Pub. Date: May 10, 2024

(65) Prior Publication Data

US 2025/0029867 A1 Jan. 23, 2025

(30) Foreign Application Priority Data

Oct. 30, 2022 (CN) ........................ 202222866915.3

(51) Int. Cl.
*H10P 72/76* (2026.01)

(52) U.S. Cl.
CPC ................................ *H10P 72/7624* (2026.01)

(58) Field of Classification Search
CPC ............ B23K 37/0435; H10P 72/7608; H10P 72/7624
See application file for complete search history.

(56) References Cited

U.S. PATENT DOCUMENTS 5,040,484 A * 8/1991 Mears ................ H10P 72/7608 269/254 R
5,566,466 A * 10/1996 Hearne .............. H10P 72/7608 198/379

(Continued)

FOREIGN PATENT DOCUMENTS

CN 203975930 U 12/2014
CN 213858891 U 8/2021

(Continued)

OTHER PUBLICATIONS

International Search Report in International application No. PCT/CN2023/110426, mailed on Oct. 12, 2023.

(Continued)

*Primary Examiner* — Bradley Duckworth
(74) *Attorney, Agent, or Firm* — PV IP PC; Wei Te Chung

(57) ABSTRACT

A material frame unlocking device may include a material frame and an insert slot, a clamping mechanism for clamping a silicon wafer is arranged on the material frame, and an unlocking mechanism for fitting the clamping mechanism is arranged on the insert slot. The clamping mechanism includes two clamping rods capable of opening and closing movements, an end of each of the two clamping rods is provided with a connecting rod, a middle portion of the connecting rod is provided with a hinge point, and an elastic assembly is arranged at one end of the connecting rod away from respective clamping rod, when the elastic assembly is (Continued)

controlled by the unlocking mechanism, the connecting rod rotates around the hinge point, and the two clamping rods are opened to separate the two clamping rods from each other.

6 Claims, 2 Drawing Sheets

(56) References Cited

U.S. PATENT DOCUMENTS

| | | | | |
|---|---|---|---|---|
| 6,003,863 | A * | 12/1999 | Barringer | H10P 72/7608<br>271/107 |
| 6,783,052 | B2 * | 8/2004 | Liao | B23K 37/0435<br>228/4.5 |
| 6,831,296 | B1 * | 12/2004 | Lee | G01R 31/2886<br>324/762.01 |
| 7,922,882 | B2 * | 4/2011 | Yoshida | H10P 72/7608<br>204/298.25 |
| 10,871,507 | B2 * | 12/2020 | Concepcion | G01R 1/0425 |
| 12,460,299 | B2 * | 11/2025 | Rye | C23C 16/4584 |
| 12,512,333 | B2 * | 12/2025 | Wada | H10P 72/0414 |
| 2022/0325430 | A1 * | 10/2022 | Seki | C25D 17/08 |
| 2023/0048466 | A1 * | 2/2023 | Baek | H10P 72/0414 |
| 2024/0139890 | A1 * | 5/2024 | Shan | B23K 31/02 |
| 2024/0321624 | A1 * | 9/2024 | Ushida | H10P 72/7608 |

FOREIGN PATENT DOCUMENTS

| | | |
|---|---|---|
| CN | 215869321 U | 2/2022 |
| CN | 217360183 U | 9/2022 |
| CN | 218706834 U | 3/2023 |
| JP | H10279072 A | 10/1998 |

OTHER PUBLICATIONS

Written Opinion of the International Search Authority in International application No. PCT/CN2023/110426,mailed on Oct. 12, 2023.

* cited by examiner

MATERIAL FRAME UNLOCKING DEVICE

CROSS-REFERENCE TO RELATED APPLICATION

The present disclosure claims priority to and the benefit of Chinese Patent Application No. 202222866915.3, filed in the China National Intellectual Property Administration on Oct. 30, 2022, the disclosure of which is hereby incorporated by reference in its entirety.

TECHNICAL FIELD

The present disclosure relates to a technical field of silicon wafer transport, and in particular to a material frame unlocking device.

BACKGROUND

In a production process of silicon wafer, a silicon rod is first cut into a silicon wafer by a wire sawing machine, and the silicon wafer is attached to a crystal tray by a resin plate at this time. To realize automatic degumming of the wire-sawed silicon wafer, the crystal tray and the silicon wafer on the crystal tray need to be conveyed to the degumming machine for degumming, so that the silicon wafer is separated from the crystal tray, and then the separated silicon wafer is conveyed to the wafer inserting machine for separation and insertion of the wafer. In the above-described production process, it is necessary to transfer the silicon wafers through the silicon wafer turnover mechanism for a plurality of times, and the silicon wafers are always clamped by the clamping assembly in the material frame of the silicon wafer turnover mechanism, thereby preventing the silicon wafers from being toppled. However, in the wafer separation process, it is necessary to release the silicon wafer, and unclamp the silicon wafer from the clamping assembly. When unlocking of the material frame is performed manually, it is difficult to position, it takes a lot of time, and unlocking also needs constant force support, which is too demanding for workers.

SUMMARY

In view of the above, a material frame unlocking device includes a material frame and an insert slot, a clamping mechanism for clamping a silicon wafer is arranged on the material frame, and an unlocking mechanism for fitting the clamping mechanism is arranged on the insert slot; the clamping mechanism includes two clamping rods capable of opening and closing movements, an end of each of the two clamping rods is provided with a connecting rod, a middle portion of the connecting rod is provided with a hinge point, and an elastic assembly is arranged at one end of the connecting rod away from respective clamping rod, when the elastic assembly is controlled by the unlocking mechanism, the connecting rod rotates around the hinge point, and the two clamping rods are opened to separate the two clamping rods from each other.

In some embodiments of the present disclosure, the elastic assembly includes: a movable rod hinged to the connecting rod, a fixing block provided on the material frame, wherein the fixing block is provided with a through hole and the movable rod passes through the through hole; and a spring sleeved on the movable rod, wherein one end of the spring abuts against the connecting rod and another end of the spring abuts against the fixing block.

In some embodiments of the present disclosure, the unlocking mechanism includes two unlocking latches capable of moving relative to each other, and a pushing assembly for driving the two unlocking latches to move, and when the pushing assembly drives the two unlocking latches to move toward each other, each of the two unlocking latches pushes one end of respective connecting rod away from the respective clamping rod, and the two clamping rods are opened.

In some embodiments of the present disclosure, the pushing assembly includes: a fixing plate; two racks arranged in parallel on the fixing plate; a plurality of rotating gears arranged between the two racks and meshed with the two racks, wherein the plurality of rotating gears are rotatably arranged on the fixing plate; and a driver for driving the two racks to move and arranged on the insert slot, wherein each of the two racks is provided with a positioning rod, and each of the two unlocking latches is arranged on respective positioning rod.

In some embodiments of the present disclosure, the driver includes an air cylinder fixed to the insert slot, and a piston rod protruding from the air cylinder is fixedly connected to one of the two racks.

In some embodiments of the present disclosure, a cover plate for protecting the racks and the rotating gears is disposed above the fixing plate.

In some embodiments of the present disclosure, each of two opposite ends of the each of the two clamping rods is provided with the connecting rod.

LIST OF REFERENCE SIGNS

| | | |
|---|---|---|
| 1: material frame; | 2: Insert slot; | 3: Clamping mechanism; |
| 4: Unlocking mechanism; | | |
| 3.1: Clamping rods; | 3.2: Connecting rods; | 3.3: Hinge point; |
| 3.4: Elastic assembly; | 3.41: Movable rod; | 3.42: Fixing block; |
| 3.43: Spring; | 3.421: Through-hole; | |
| 4.1: Unlocking latches; | 4.2: Pushing assembly; | 4.21: Fixing plate; |
| 4.22: Racks; | 4.23: Rotating gears; | 4.24: Cover plate; |
| 4.25: Positioning rods; | 4.26: Driver; | 4.261: Air cylinder; |

DETAILED DESCRIPTION

The technical solution in the embodiments of the present disclosure will be clearly and completely described with reference to the accompanying drawings.

The innovation of the present disclosure is that the opening and closing of the clamping rods is controlled by the unlocking mechanism, which does not require manual unlocking, with a high degree of automation and high unlocking efficiency.

Figure 1:
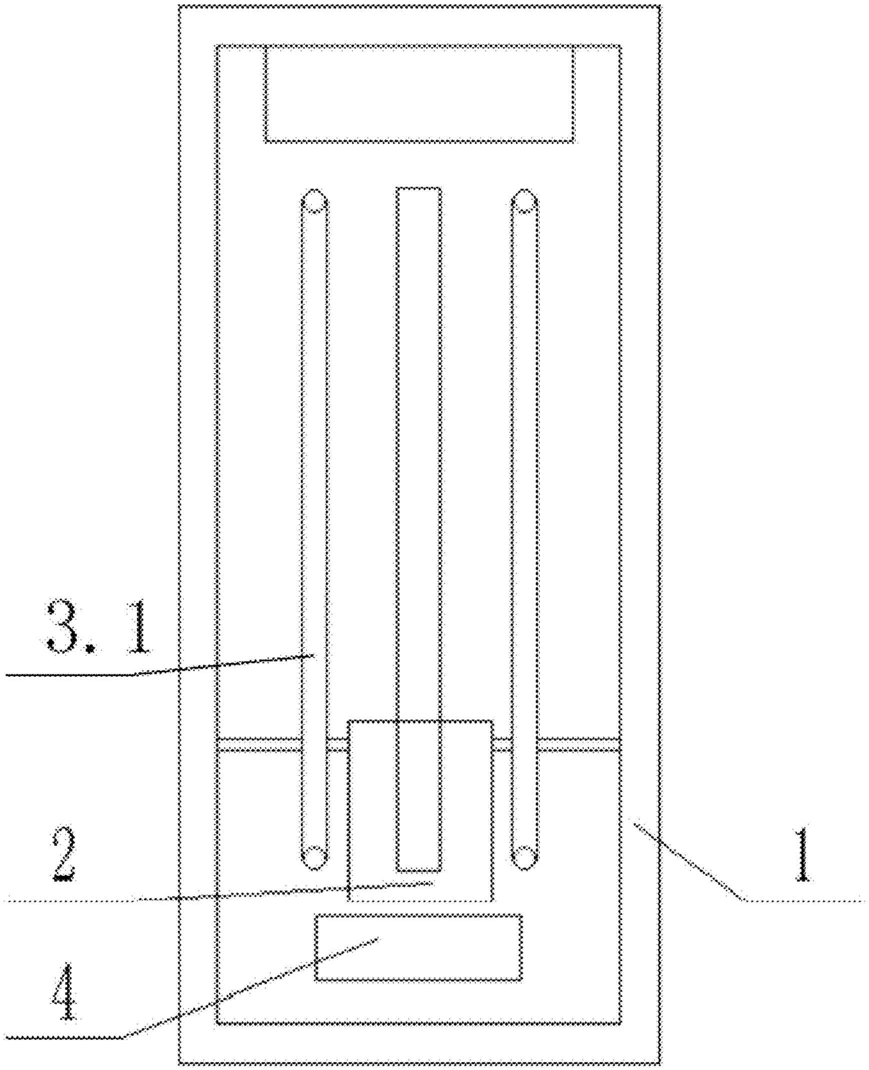
FIG. 1 is a top view of a material frame unlocking device according to the present disclosure.
Figure 2:
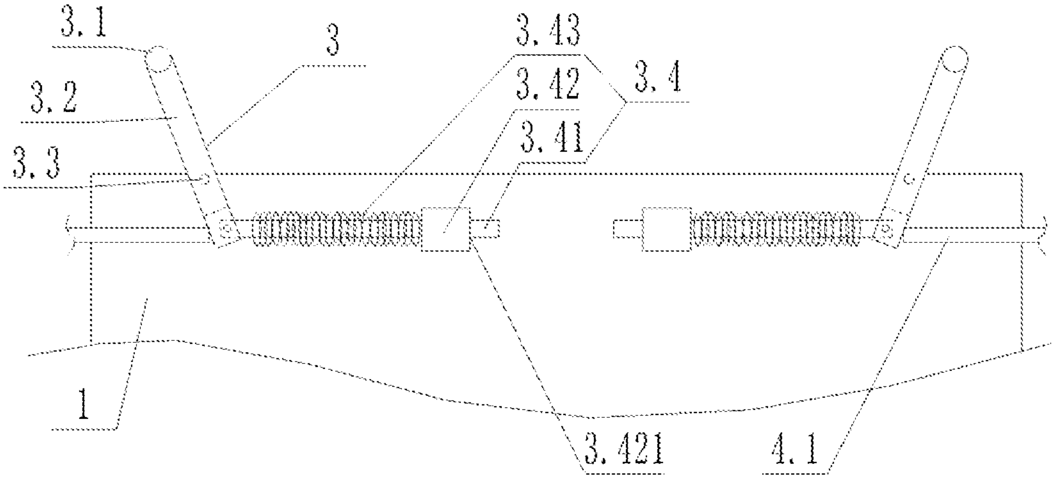
FIG. 2 is a schematic view of the structure of a clamping mechanism in the material frame unlocking device.
Figure 3:
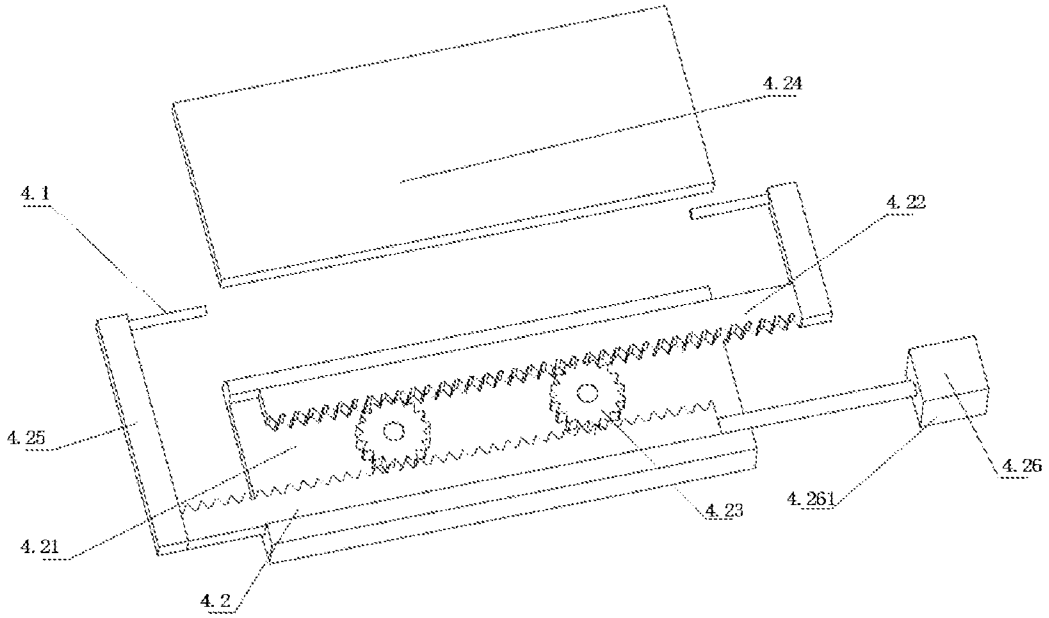
FIG. 3 is a schematic structural view of an unlocking mechanism in the material frame unlocking device.

As shown in FIGS. 1, 2 and 3, a material frame unlocking device includes a material frame 1 and an insert slot 2, a clamping mechanism 3 for clamping a silicon wafer is arranged on the material frame 1, and an unlocking mechanism 4 for fitting the clamping mechanism 3 is arranged on the insert slot 2; the clamping mechanism 3 includes a pair of clamping rods 3.1 capable of opening and closing movements, both ends of the clamping rods 3.1 are provided with connecting rods 3.2, and a middle portion of the connecting rod 3.2 is provided with a hinge point 3.3. One end of the connecting rod 3.2 away from the clamping rod 3.1 is provided with an elastic assembly 3.4, the elastic assembly 3.4 includes a movable rod 3.41 hinged to the connecting rod, a fixing block 3.42 provided on the material frame 1 and having a through-hole 3.421 through which the movable rod 3.41 passes, and a spring 3.43 sleeved on the movable rod 3.41, one end of the spring 3.43 abuts against the connecting rod 3.2, and the other end of the spring 3.43 abuts against the fixing block 3.42. The unlocking mechanism 4 includes two unlocking latches 4.1 moving relative to each other, and a pushing assembly 4.2 for driving the unlocking latches 4.1 to move. The pushing assembly 4.2 includes a fixing plate 4.21, two racks 4.22 arranged in parallel on the fixing plate 4.21, and a plurality of rotating gears 4.23 arranged between the two racks 4.22 to be meshed with the two racks 4.22 and rotatably provided on the fixing plate 4.21. A cover plate 4.24 for protecting the racks 4.22 and the rotating gears 4.23 is arranged above the fixing plate 4.21, the fixing plate 4.21 and the cover plate 4.24 limit the two racks 4.22, a stopper is fixedly provided on the inner wall of the fixing plate 4.21 or the cover plate 4.24, the stopper is used for limiting the side of the two racks 4.22 away from the rotating gear 4.23, so that the two racks 4.22 may slide in the space defined by the fixing plate 4.21, the cover plate 4.24, the rotating gear 4.23 and the stopper. A driver 4.26 for driving the rack 4.22 to move is arranged on the insert slot 1, the driver 4.26 includes an air cylinder 4.261 fixed on the insert slot 1, a piston rod protruded from the air cylinder 4.261 is fixedly connected to one of the racks 4.22, positioning rods 4.25 are respectively arranged on the two racks 4.22, and the unlocking pin 4.1 is arranged on the positioning rod 4.25. When the pushing assembly 4.2 drives the two unlocking latches 4.1 to move toward each other, the unlocking latch pushes one end of the connecting rod 3.2 away from the clamping rod 3.1 and the two clamping rods 3.1 are opened.

In operation, the clamping rods 3.1 clamp the silicon wafer due to the elastic force generated by the deformation of the spring 3.43, the piston rod of the air cylinder 4.261 drives one rack 4.22 to retract, the rack 4.22 drives the rotating gears 4.23 to rotate, and the other rack 4.22 is driven by the rotating gears 4.23 to move, the two racks 4.22 move toward each other synchronously, the two unlocking latches 4.1 move toward each other, the unlocking latches 4.1 push the connecting rods 3.2, the clamping rods 3.1 are opened to release the silicon wafer, and the piston rod of the air cylinder 4.261 is extended. Similarly, the unlocking latches 4.1 retract, the compressed spring 3.43 recovers, and the clamping rod 3.1 closes.

The technical solution of the present disclosure has the following advantages:

1. In the present disclosure, the opening and closing of the clamping rod is controlled by the unlocking mechanism, which does not require manual unlocking, with a high degree of automation and high unlocking efficiency.
2. In the present disclosure, the cover plate is additionally provided to protect the racks and the rotating gears.

The described embodiments are only a part of the embodiments of the present disclosure, and not all of the embodiments. Based on the embodiments of the present disclosure, all other embodiments obtained by a person of ordinary skill in the art without involving any inventive effort are within the scope of the present disclosure.

What is claimed is:

1. A material frame unlocking device comprising a material frame and an insert slot, wherein a clamping mechanism for clamping a silicon wafer is arranged on the material frame, and an unlocking mechanism for actuating the clamping mechanism is arranged on the insert slot; and wherein the clamping mechanism comprises two clamping rods capable of opening and closing movements, an end of each of the two clamping rods is provided with a connecting rod, a middle portion of the connecting rod is provided with a hinge point, and an elastic assembly is arranged at one end of the connecting rod away from the respective clamping rod, when the elastic assembly is controlled by the unlocking mechanism, the connecting rod rotates around the hinge point, and the two clamping rods are opened to separate the two clamping rods from each other;

the elastic assembly comprises:

a movable rod hinged to the connecting rod, a fixing block provided on the material frame, wherein the fixing block is provided with a through hole and the movable rod passes through the through hole; and a spring sleeved on the movable rod, wherein one end of the spring abuts against the connecting rod and another end of the spring abuts against the fixing block.

2. The material frame unlocking device according to claim 1, wherein the unlocking mechanism comprises two unlocking latches capable of moving relative to each other, and a pushing assembly for driving the two unlocking latches to move, and when the pushing assembly drives the two unlocking latches to move toward each other, each of the two unlocking latches pushes one end of a respective connecting rod away from the respective clamping rod, and the two clamping rods are opened.

3. The material frame unlocking device according to claim 2, wherein the pushing assembly comprises:

a fixing plate;

two racks arranged in parallel on the fixing plate;

a plurality of rotating gears arranged between the two racks and meshed with the two racks, wherein the plurality of rotating gears are rotatably arranged on the fixing plate;

a driver for driving the two racks to move and arranged on the insert slot, wherein each of the two racks is provided with a positioning rod, and each of the two unlocking latches is arranged on a respective positioning rod.

4. The material frame unlocking device according to claim 3, wherein the driver comprises an air cylinder fixed to the insert slot, and a piston rod protruding from the air cylinder is fixedly connected to one of the two racks.

5. The material frame unlocking device according to claim 3, wherein a cover plate for protecting the two racks and the plurality of rotating gears is disposed above the fixing plate.

6. The material frame unlocking device according to claim 1, wherein each of two opposite ends of each of the two clamping rods is provided with the connecting rod.

* * * * *